(12) United States Patent
Lee et al.

(10) Patent No.: US 11,718,183 B2
(45) Date of Patent: Aug. 8, 2023

(54) METHOD FOR CONTROLLING TONE OF ELECTRIC VEHICLE BASED ON MOTOR VIBRATION

(71) Applicants: HYUNDAI MOTOR COMPANY, Seoul (KR); KIA MOTORS CORPORATION, Seoul (KR)

(72) Inventors: Dong-Chul Lee, Anyang-si (KR); In-Soo Jung, Goyang-si (KR)

(73) Assignees: Hyundai Motor Company, Seoul (KR); Kia Motors Corporation, Seoul (KR)

( * ) Notice: Subject to any disclaimer, the term of this patent is extended or adjusted under 35 U.S.C. 154(b) by 356 days.

(21) Appl. No.: 17/029,805

(22) Filed: Sep. 23, 2020

(65) Prior Publication Data

US 2021/0379998 A1 Dec. 9, 2021

(30) Foreign Application Priority Data

Jun. 4, 2020 (KR) .................. 10-2020-0067689

(51) Int. Cl.
*B60L 15/00* (2006.01)
*B60L 15/20* (2006.01)
(Continued)

(52) U.S. Cl.
CPC .............. *B60L 15/20* (2013.01); *G10K 15/04* (2013.01); *H03G 3/3005* (2013.01); *H04R 3/04* (2013.01);
(Continued)

(58) Field of Classification Search
CPC .. B60L 15/20; B60L 2250/26; B60L 2260/26; B60L 2270/42; B60L 2240/12;
(Continued)

(56) References Cited

U.S. PATENT DOCUMENTS 8,179,234 B1 * 5/2012 Atwood ................. B60Q 5/008
340/384.1
9,911,405 B2 3/2018 Lee et al.
(Continued)

FOREIGN PATENT DOCUMENTS

| CN | 107415870 A | 12/2017 |
| DE | 1016224984 A1 | 6/2017 |
| KR | 10-2017-0128938 A | 11/2017 |

*Primary Examiner* — Jacob M Amick
*Assistant Examiner* — Sherman D Manley
(74) *Attorney, Agent, or Firm* — Fox Rothschild LLP

(57) ABSTRACT

A method for controlling a tone of an electric vehicle (EV) based on motor vibration may include: calculating an order component from a vibration signal of an EV motor of an electric vehicle, extracting a first order component with the greatest linearity for motor output torque among the calculated order component, then calculating an order frequency by transforming revolutions per minute (RPM) of the EV motor into frequency, setting an EV mode tone by applying a vibration level of the first order component to a level of the order frequency to be output and rearranging the order component, and outputting the set EV mode tone, and may apply an LMS filter algorithm, FFT/IFFT transforms, and an order tracking algorithm in extracting the first order component.

19 Claims, 12 Drawing Sheets

(51) Int. Cl.
*G10K 15/04* (2006.01)
*H04R 3/04* (2006.01)
*H03G 3/30* (2006.01)
*H04R 1/02* (2006.01)

(52) U.S. Cl.
CPC ....... *B60L 2250/26* (2013.01); *B60L 2260/26* (2013.01); *B60L 2270/42* (2013.01); *H03G 2201/103* (2013.01); *H04R 1/025* (2013.01); *H04R 2499/13* (2013.01)

(58) Field of Classification Search
CPC ......... B60L 2240/421; B60L 2270/142; G10K 15/04; G10K 15/02; G10K 11/1785; H03G 3/3005; H03G 2201/103; H03G 5/16; H04R 3/04; H04R 1/025; H04R 2499/13; H04R 2430/01; G01H 1/003; Y02T 10/64; Y02T 10/72; B60Q 5/00; B60Q 5/008; B60Q 2300/11; B60R 16/0373; B60Y 2200/91; B60Y 2400/3044

See application file for complete search history.

(56) References Cited

U.S. PATENT DOCUMENTS

| | | | |
|---|---|---|---|
| 10,065,561 B1* | 9/2018 | Bastyr | B60Q 5/008 |
| 10,319,360 B1* | 6/2019 | He | G10K 11/1752 |
| 10,607,626 B1* | 3/2020 | Lung | G01M 7/00 |
| 2004/0013273 A1* | 1/2004 | Vaishya | G10K 11/17825 381/71.2 |
| 2005/0216145 A1* | 9/2005 | Bellinger | B60W 10/10 701/33.9 |
| 2014/0379192 A1* | 12/2014 | Tanaka | B60W 50/0098 701/22 |
| 2017/0001559 A1* | 1/2017 | Kwon | G10K 15/02 |
| 2017/0330550 A1* | 11/2017 | Lee | F02B 77/13 |
| 2018/0290659 A1* | 10/2018 | Tsukada | B60W 20/40 |
| 2020/0184946 A1* | 6/2020 | Jung | B60C 5/008 |

* cited by examiner

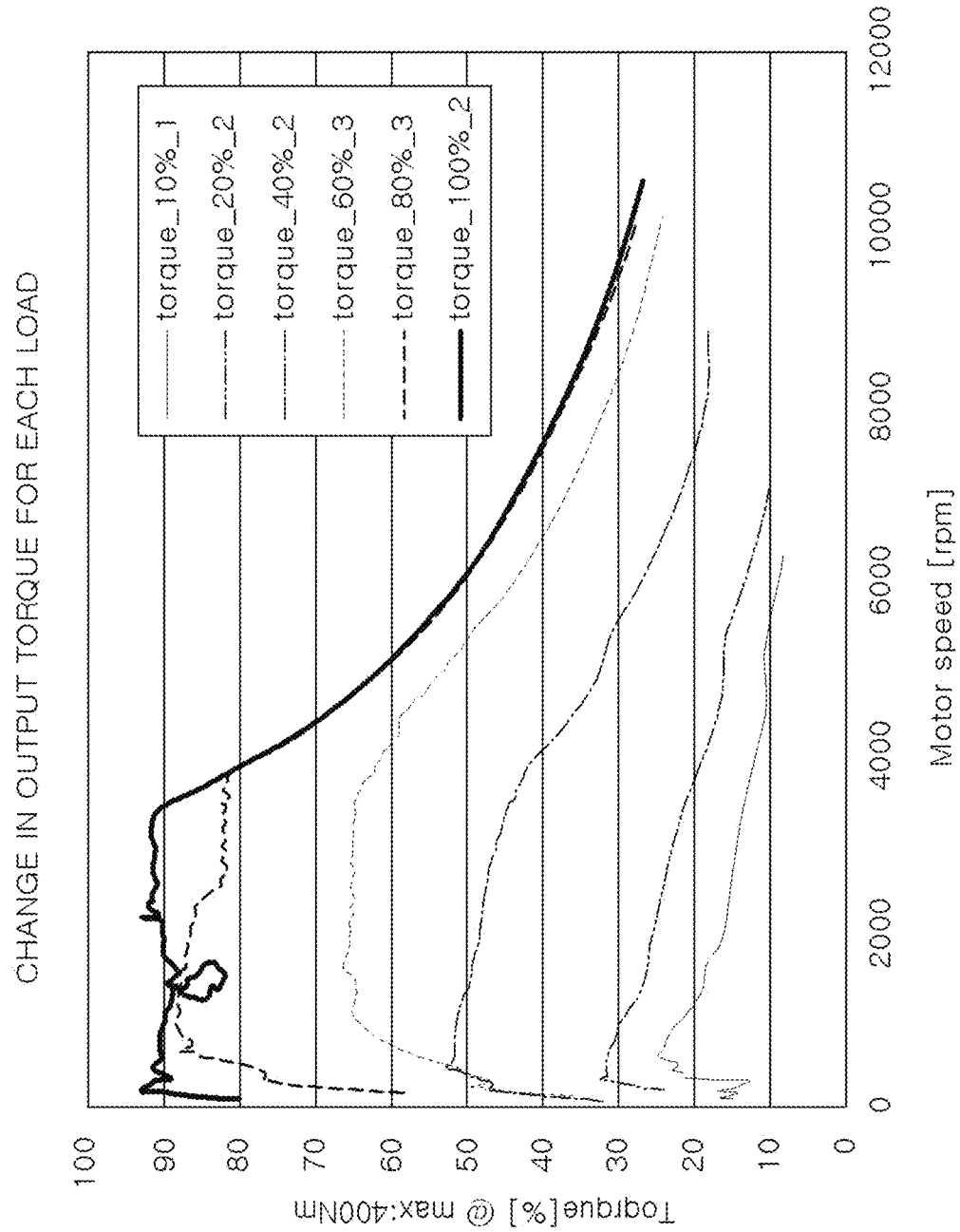

d(n) : VIBRATION SIGNAL MEASURED IN REAL TIME
e(n) : VIBRATION SIGNAL IN WHICH Nth ORDER
       COMPONENT IS REMOVED
y(n) : $N^{th}$ ORDER EXTRACTED FROM VIBRATION SIGNAL
x(n) : $N^{th}$ ORDER LEVEL INFORMATION EXTRACTION VALUE

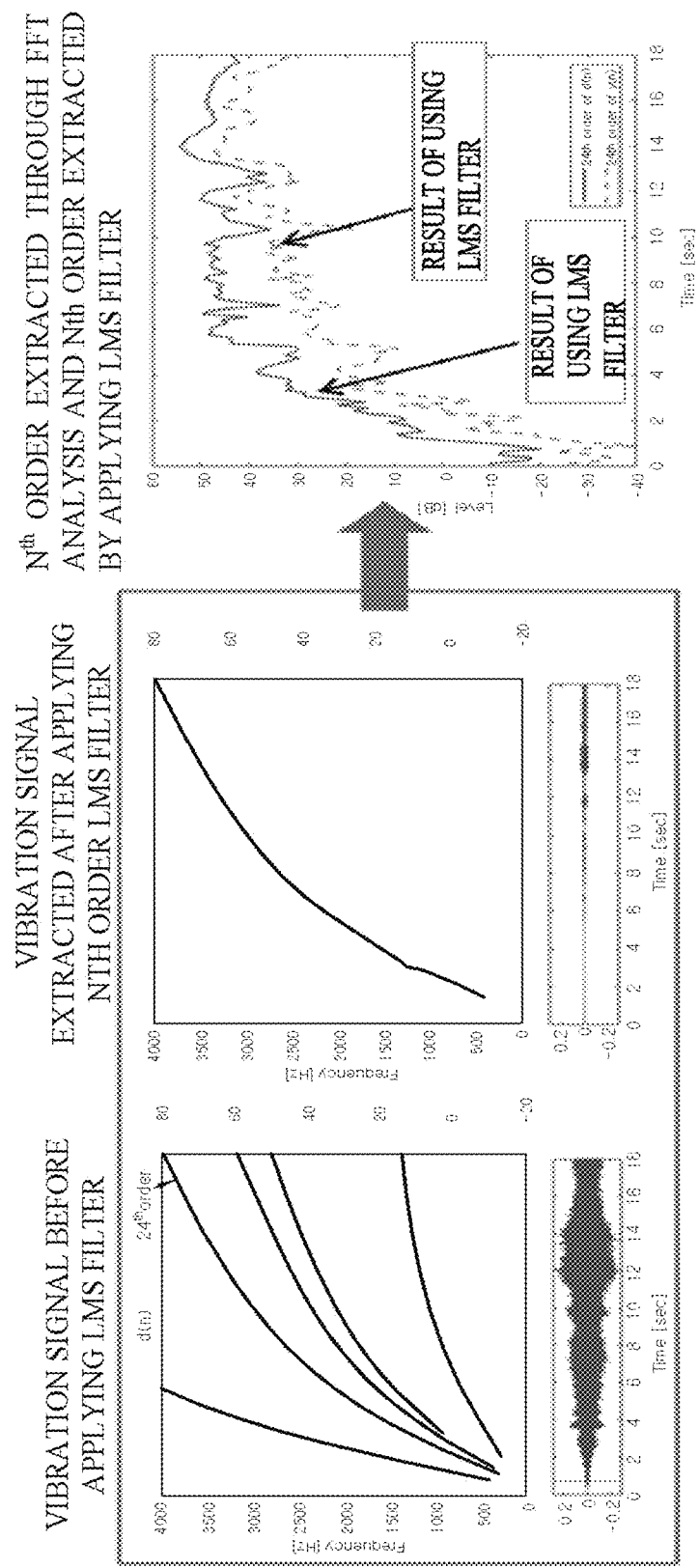

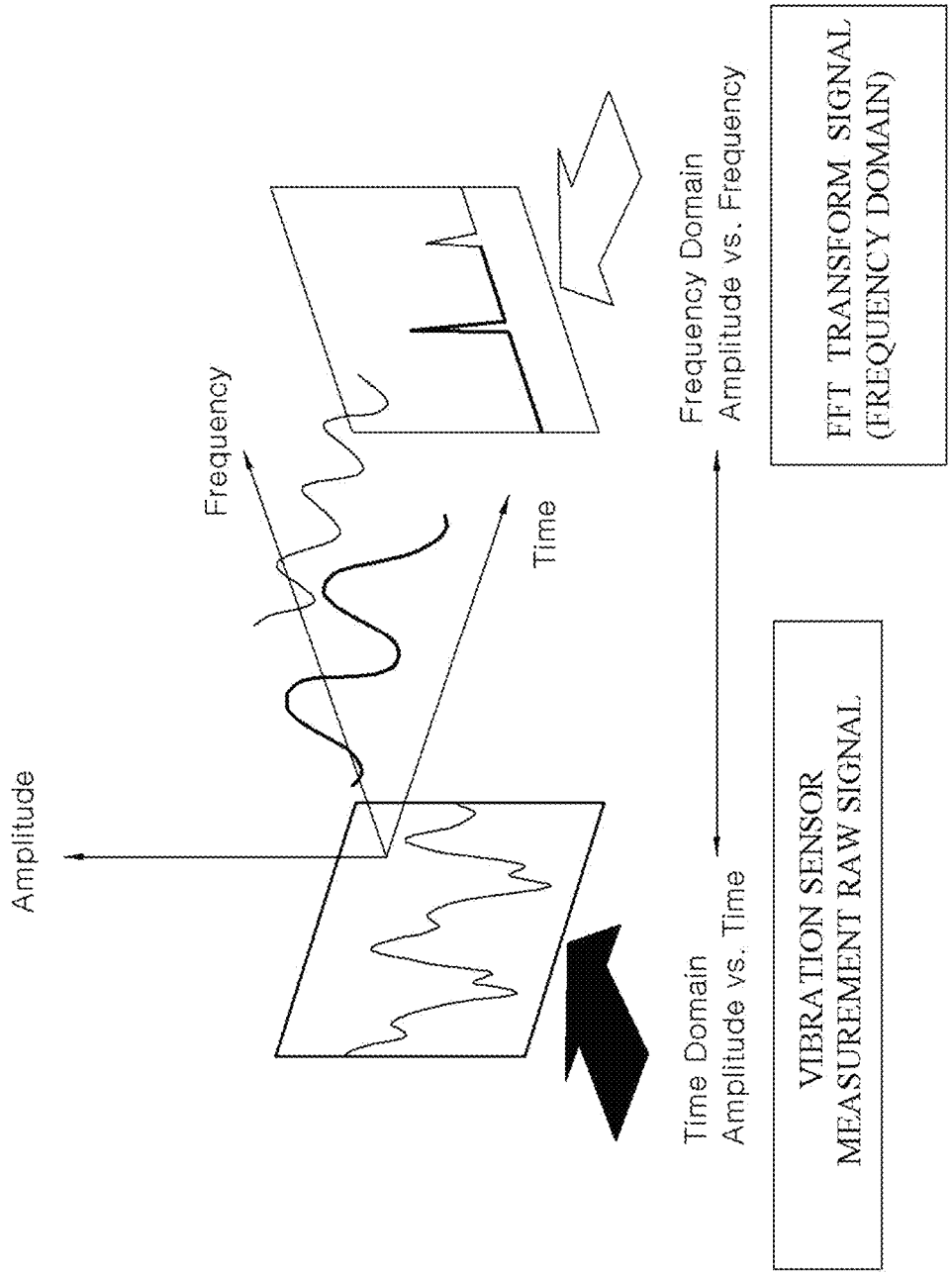

FIG.7
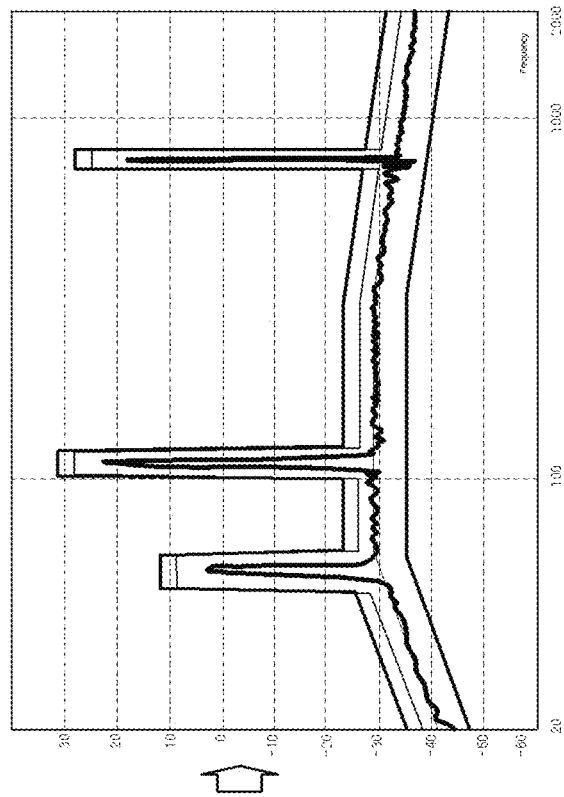
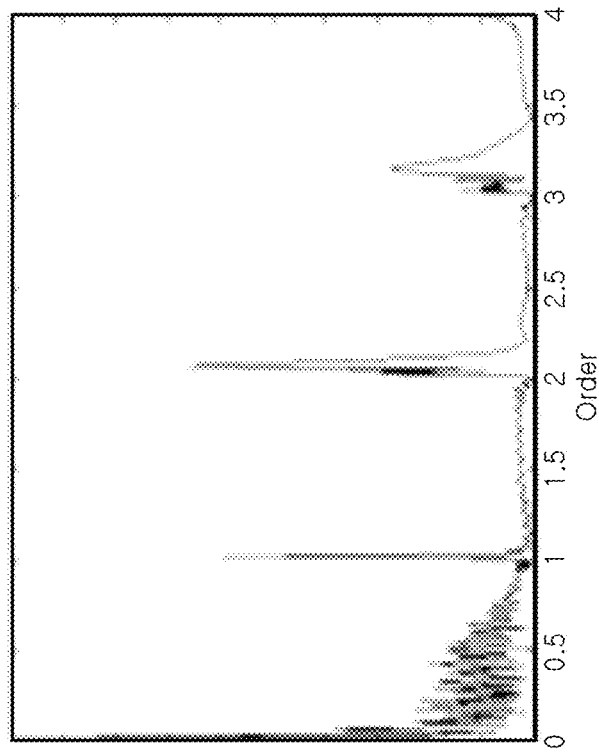

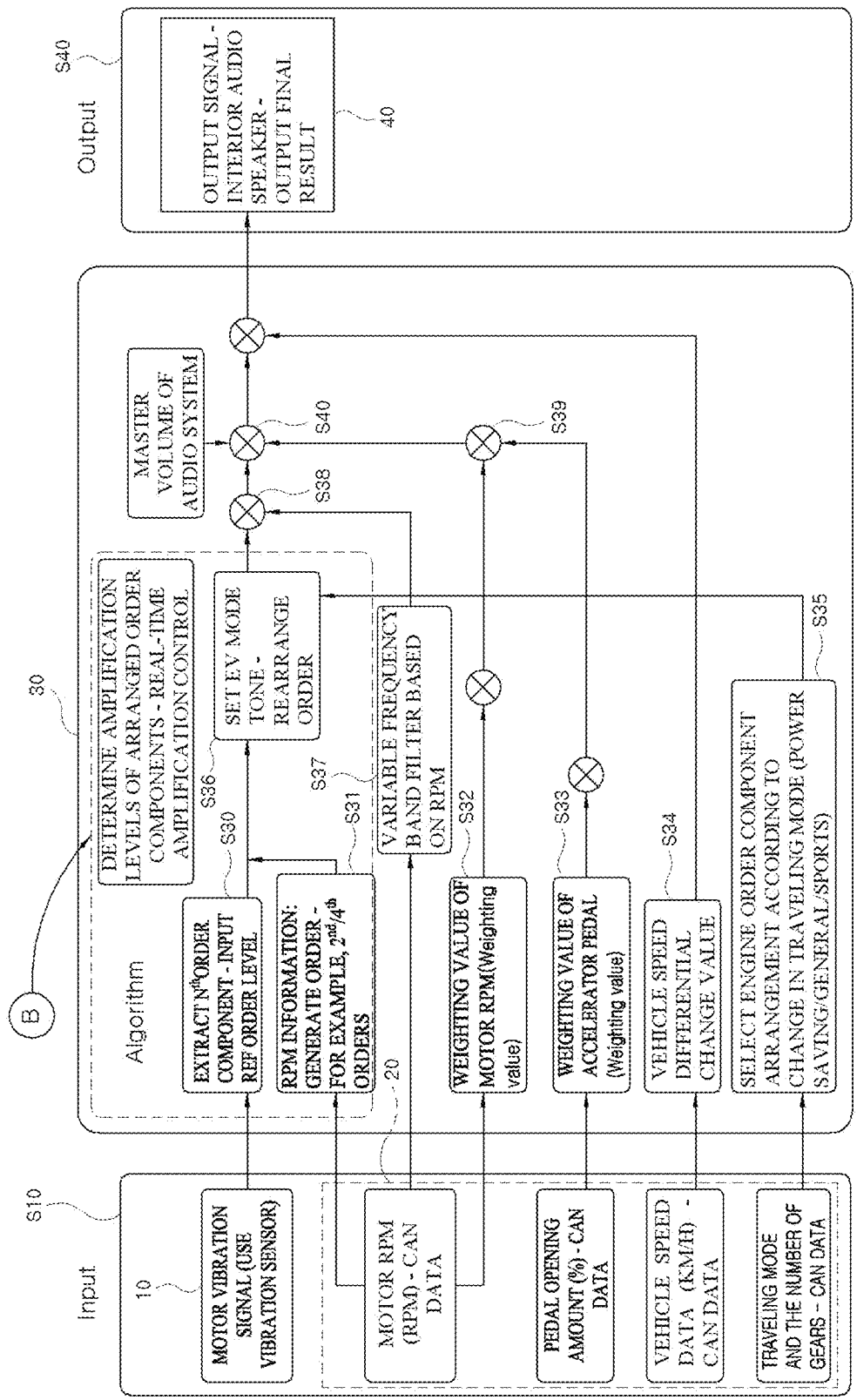

METHOD FOR CONTROLLING TONE OF ELECTRIC VEHICLE BASED ON MOTOR VIBRATION

CROSS-REFERENCE TO RELATED APPLICATION

The present application claims priority to and the benefit of Korean Patent Application No. 10-2020-0067689, filed on Jun. 4, 2020, which is incorporated herein by reference in its entirety.

TECHNICAL FIELD

The present disclosure relates to a method for controlling a tone of an electric vehicle based on motor vibration which controls a tone of an EV based on motor vibration of the EV using a motor as a power source.

BACKGROUND

Recently, due to the appearance of the vehicle which does not emit engine sounds, such as EVs which may travel using all motors, it is a trend that a noise generating device is mandatorily installed to an environmentally-friendly vehicle. Generally, noise generated by a vehicle gives discomfort to a driver and a pedestrian around the vehicle to some extent and such noise serves to increase the vehicle recognition ability of the pedestrian to recognize the vehicle around the pedestrian through vision and hearing, thereby preventing traffic accidents in advance.

Accordingly, a tone control for the EV has been mainly developed to store and reproduce virtual sound because, unlike the vehicle of an internal combustion engine, it is very quiet during acceleration/deceleration, and only electromagnetic noise of high frequency is generated.

Recently, a tone control technology is recognized as a merchantability dimension of the vehicle by improving the driving pleasure of the driver through hearing and vision. Accordingly, it is required to store and generate music or sound suitable for the EV.

The contents described here are to help the understanding of the background of the present disclosure, and may include what is not previously known to those skilled in the art to which the present disclosure pertains.

SUMMARY

Accordingly, the present disclosure proposes a technology which matches the performance of a vehicle based on the motor characteristics of an EV replacing the power of a general internal combustion engine, and controls the tone desired by a customer.

The present disclosure provides a technology of controlling the tone of the EV which may extract in real time the order components of motor vibration, which has the high correlation with the motor output characteristics of the EV corresponding to the power performance of the internal combustion engine, and then implement the sound required by the internal combustion engine matching the power performance characteristics of the vehicle and perform an ultra-modern sound control using the high frequency characteristics.

A method for controlling a tone of an electric vehicle based on motor vibration according to the present disclosure includes:

calculating an order component from a vibration signal of a rotating EV motor;

extracting an $N^{th}$ order component with the greatest linearity for motor output torque among the calculated order components;

calculating an order frequency by transforming RPM of the EV motor into frequency;

setting an EV mode tone by applying a vibration level of the $N^{th}$ order component to a level of the order frequency to be output and rearranging the order components; and outputting the set EV mode tone.

In addition, an $N^{th}$ order component with a determination coefficient ($R^2$) of 90% or more is extracted as the $N^{th}$ order component with the greatest linearity, and a location of the vibration sensor sensing the vibration signal of the EV motor is located, where the highest amplitude is detected, when frequencies are swept.

In addition, adjusting an output volume by applying a frequency band pass filter based on the RPM of the EV motor, assigning a weighting value to the RPM of the EV motor or the pedal position, or adjusting an output volume calculating a vehicle speed differential change value from vehicle speed needs to be performed prior to the outputting of the set EV mode tone.

In addition, the order components according to a change in traveling mode (power saving/general/sports) is selected to be arranged in the setting the EV mode tone.

A method for controlling a tone of an electric vehicle based on motor vibration, as a preferred exemplary embodiment, includes:

calculating an order component from a vibration signal of a rotating EV motor;

extracting an $N^{th}$ order component with the greatest linearity for motor output torque among the calculated order components;

calculating an order frequency by transforming RPM of the EV motor into frequency;

setting an EV mode tone by applying a vibration level of the $N^{th}$ order component to a level of the order frequency to be output rearranging the order components; and outputting the set EV mode tone, in which the extracting of the $N^{th}$ order component includes extracting the $N^{th}$ order component by updating a weighting value when the vibration signal is recirculated using an LMS filter algorithm for the vibration signal to cause the level of the $N^{th}$ order component to converge to 0.

A method for controlling a tone of an electric vehicle based on motor vibration, as a preferred exemplary embodiment, includes:

calculating an order component from a vibration signal of a rotating EV motor;

extracting an $N^{th}$ order component with the greatest linearity for motor output torque among the calculated order components;

calculating an order frequency by transforming RPM of the EV motor into frequency;

setting an EV mode tone by applying a vibration level of the $N^{th}$ order component to a level of the order frequency to be output rearranging the order components; and outputting the set EV mode tone, in which the extracting of the $N^{th}$ order component includes extracting the $N^{th}$ order component through performing Fast Fourier Transform (FFT) for the vibration signal;

performing resampling through a Non-equispaced Fast Fourier Transform (NFFT); and performing an Inverse Fast Fourier Transform (IFFT).

A preferred exemplary embodiment includes:

calculating an order component from a vibration signal of a rotating EV motor;

extracting an $N^{th}$ order component with the greatest linearity for motor output torque among the calculated order components;

calculating an order frequency by transforming RPM of the EV motor into frequency;

setting an EV mode tone by applying a vibration level of the $N^{th}$ order component to a level of the order frequency to be output rearranging the order components; and outputting the set EV mode tone, in which the extracting the $N^{th}$ order component includes extracting the $N^{th}$ order component using order tracking analysis for the EV motor and an RPM-based band pass filter.

The present disclosure is a technology which matches the performance of the vehicle based on the motor characteristics of the EV, and controls the tone desired by the customer, and may extract in real time the order components of the motor vibration which has the high correlation with the motor output characteristics of the EV, and then implement the sound required by the internal combustion engine matching the power performance characteristics of the vehicle and perform the ultra-modern sound control using the high-frequency characteristics.

In addition, it may be possible to reflect the change in power performance and to implement the sound matching the driver's willingness to accelerate.

Particularly, in extracting the $N^{th}$ order component, it is possible to select the algorithm for extracting the $N^{th}$ order component in terms of speed and accuracy. Specifically, it is possible to improve the calculation speed using the LMS filter algorithm, and to increase the calculation amount and improve the accuracy using the FFT/IFFT transform algorithms. On the other hand, the order tracking algorithm may reduce the calculation amount. The present disclosure selectively adopts the aforementioned algorithms in consideration of the speed, the accuracy, and the calculation amount rather than presenting only any one algorithm among them.

In addition, it may be possible to reinforce the tone using the speaker with the control set value using the $N^{th}$ order component upon acceleration, and to provide the natural deceleration tone by applying the fade out considering the EV characteristics (silence) upon deceleration.

DRAWINGS

FIGS. 3A, 3B, 3C are graphs illustrating changes in order degree and order level according to a change in an output torque for each load.

FIG. 5A, 5B are a diagram illustrating a case of applying a least mean square (LMS) filter algorithm which is advantageous for a calculation speed.

FIG. 6 is a diagram illustrating a case of applying Fast Fourier Transform (FFT)/Inverse Fast Fourier Transform (IFFT) algorithms which are advantageous for accuracy.

FIG. 7 is a diagram illustrating a case of applying an order tracking algorithm with a small calculation amount, which extracts an $N^{th}$ order component based on RPM information.

FIG. 8A, 8B are a diagram illustrating a case of dividing a vibration sensor signal processing controller and an external amplifier signal processing controller.

DETAILED DESCRIPTION

Hereinafter, exemplary embodiments of the present disclosure will be described in detail with reference to the accompanying exemplary drawings, and these exemplary embodiments are examples and may be implemented in various different forms by those skilled in the art to which the present disclosure pertains, and thus are not limited to the exemplary embodiments described herein.

Figure 1:
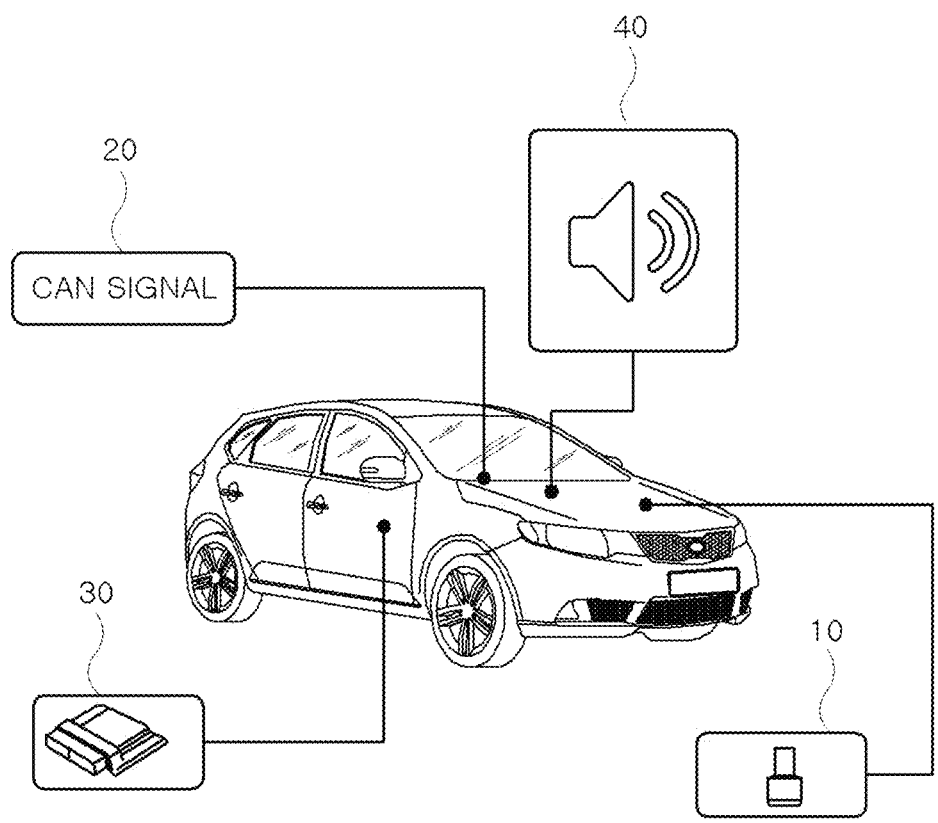
FIG. 1 is a diagram illustrating an EV to which the present disclosure is applied.
Figure 2:
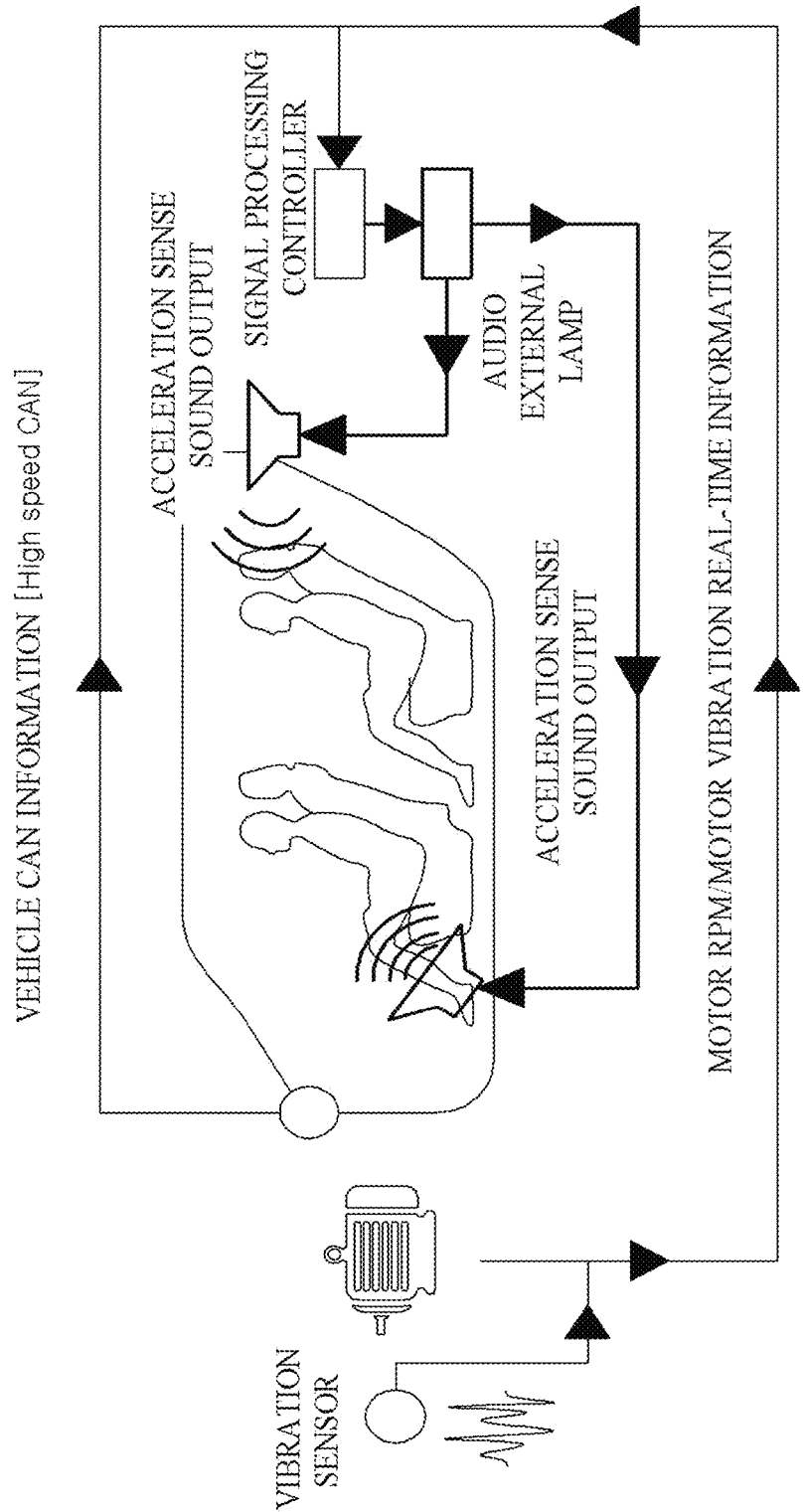
FIG. 2 is a diagram illustrating an example of the flow of input and output values in the present disclosure.

FIG. 1 is a diagram illustrating an EV to which the present disclosure is applied, and FIG. 2 is a diagram illustrating an example of the flow of input and output values in the present disclosure.

Referring to FIG. 1, the present disclosure mounted to the EV includes a vibration sensor 10 which measures a vibration signal generated when a motor rotates, a CAN signal 20 which is connected through CAN communication in a vehicle, a signal processing controller 30 which processes the vibration signal and the CAN signal, and a sound output device 40 in implementing the present disclosure.

The vibration signal of the motor measured by the vibration sensor 10 is input to the signal processing controller 30, and vibration characteristics may be measured according to real-time motor rotation. The vibration sensor 10 may also use an MEMS sensor by which a digital signal is self-processed including a knocking sensor method capable of converting an analog signal into a digital signal through a digital signal conversion module.

The motor RPM, the position of an accelerator pedal, and a vehicle speed may be obtained in real time from the CAN signal 20, and information about a change in driving mode, motor power, and vehicle traveling characteristics may also be obtained.

The signal processing controller may determine a traveling condition or driver's willingness to acceleration/deceleration/constant speed traveling from the vibration signal, which is an input signal, and the CAN signal, and generate a target tone signal using the motor RPM and the vibration signal to transmit the target tone signal to the sound output device 40 as output data. The signal processing controller may be applied to an in-vehicle audio digital signal processor (DSP). The DSP may also be used for voice coding which digitalizes voice which is an analog signal, and is an integrated circuit which may allow a machine device to quickly process the digital signal.

The sound output device 40 outputs the output data received from the signal processing controller through a speaker installed for outputting a specific frequency band within an engine room in which the motor is embedded. The sound output device may also be installed not inside but outside the engine room for the purpose of protecting the pedestrian, or the output data may also be output through an audio speaker installed inside the vehicle for the driver or the passenger.

FIG. 2 is a diagram illustrating obtaining real-time information about a motor RPM and motor vibration from a vibration sensor and vehicle CAN information to perform the calculation in the signal processing controller, and then outputs acceleration sense sound in the vehicle through an audio external amplifier, and the sound output device may be located on the exterior of the vehicle, the interior of the engine room, or the like as described above.

The vibration level due to the rotation of the EV motor represents a very low value compared to the level due to combustion of the internal combustion engine. Accordingly, it is important to select the location of the sensor capable of accurately extracting a small change in vibration level. A method for selecting the location of the sensor is as follows.

(1) First, a location with high amplitude should be selected while frequencies are swept through the analysis of the structural analysis model of the EV motor, and the location should be a flat surface for mounting the vibration sensor, so that the location with the high amplitude sensitivity should be selected based on the flat surface. In addition, the vibration measurement direction of the vibration sensor is measured in a direction perpendicular to a seat surface. That is, the vertical change in amplitude with respect to the seat surface may be predicted through the analysis.

(2) After the structural analysis, by actually measuring changes in output torque for each motor load and the level for each motor vibration order at the same time to perform regression analysis for the change in motor output torque according to the motor load and the change in order level of the motor, a location with the high sensitivity forming the maximum amplitude may be selected by extracting the output characteristics of the motor and an $N^{th}$ order component with a determination coefficient ($R^2$) of 0.9 or more. That is, the location which best represents the characteristics of the amplitude due to the motor vibration may be selected as a final location.

In the EV, power performance of the motor is expressed as the motor output torque. In the present disclosure, in order to control the tone based on the motor vibration, the component with the high correlation with the tendency of the motor output torque is extracted from the order degree and the order level characteristics of the motor based on the motor RPM among a lot of information about the vibration signal of the motor, and thus should be selected as the $N^{th}$ order component. The order components is variously changed depending on the internal structure of the motor including the number of magnetic cores or the like.

Figure 3B:
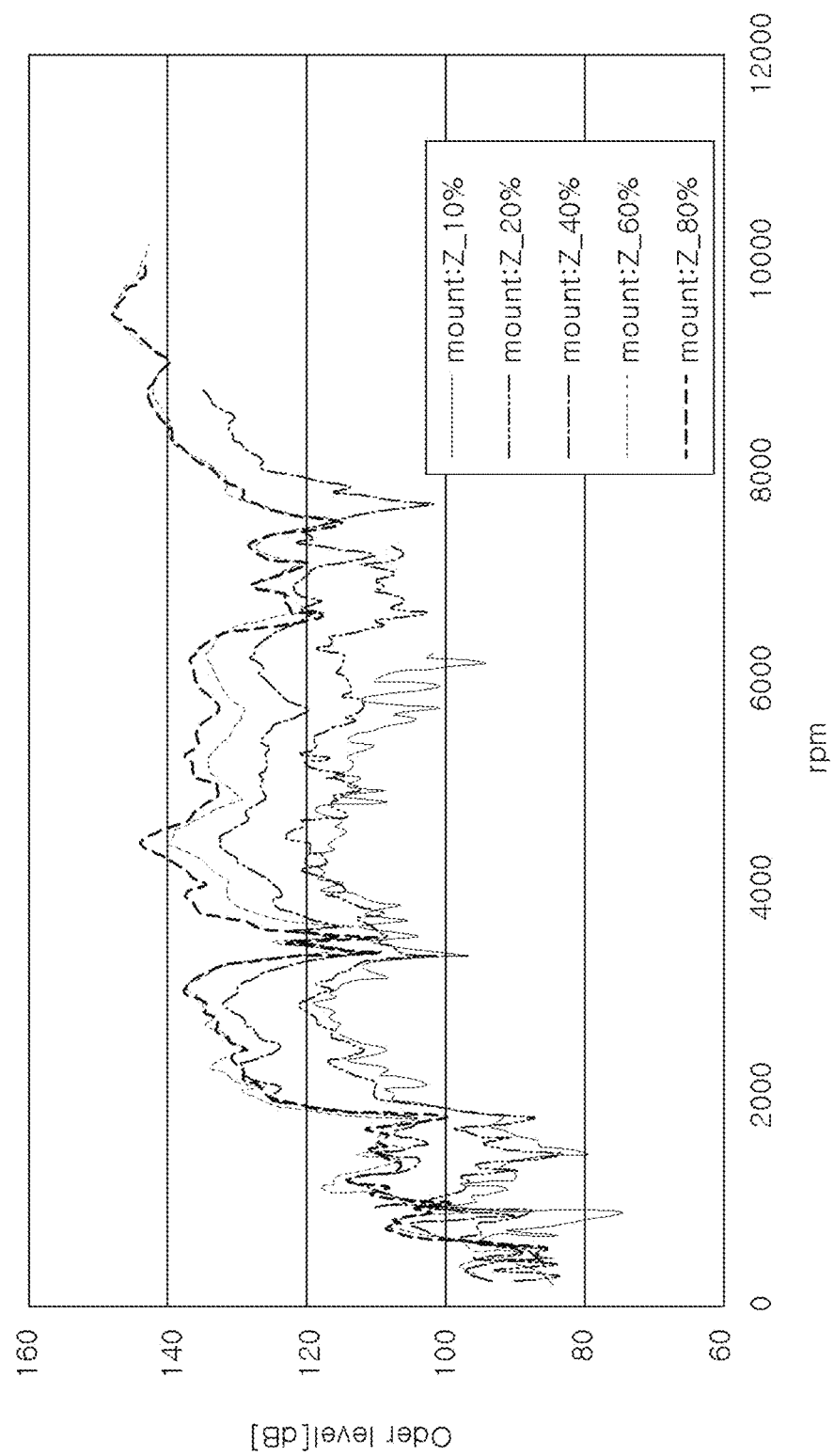
Figure 3C:
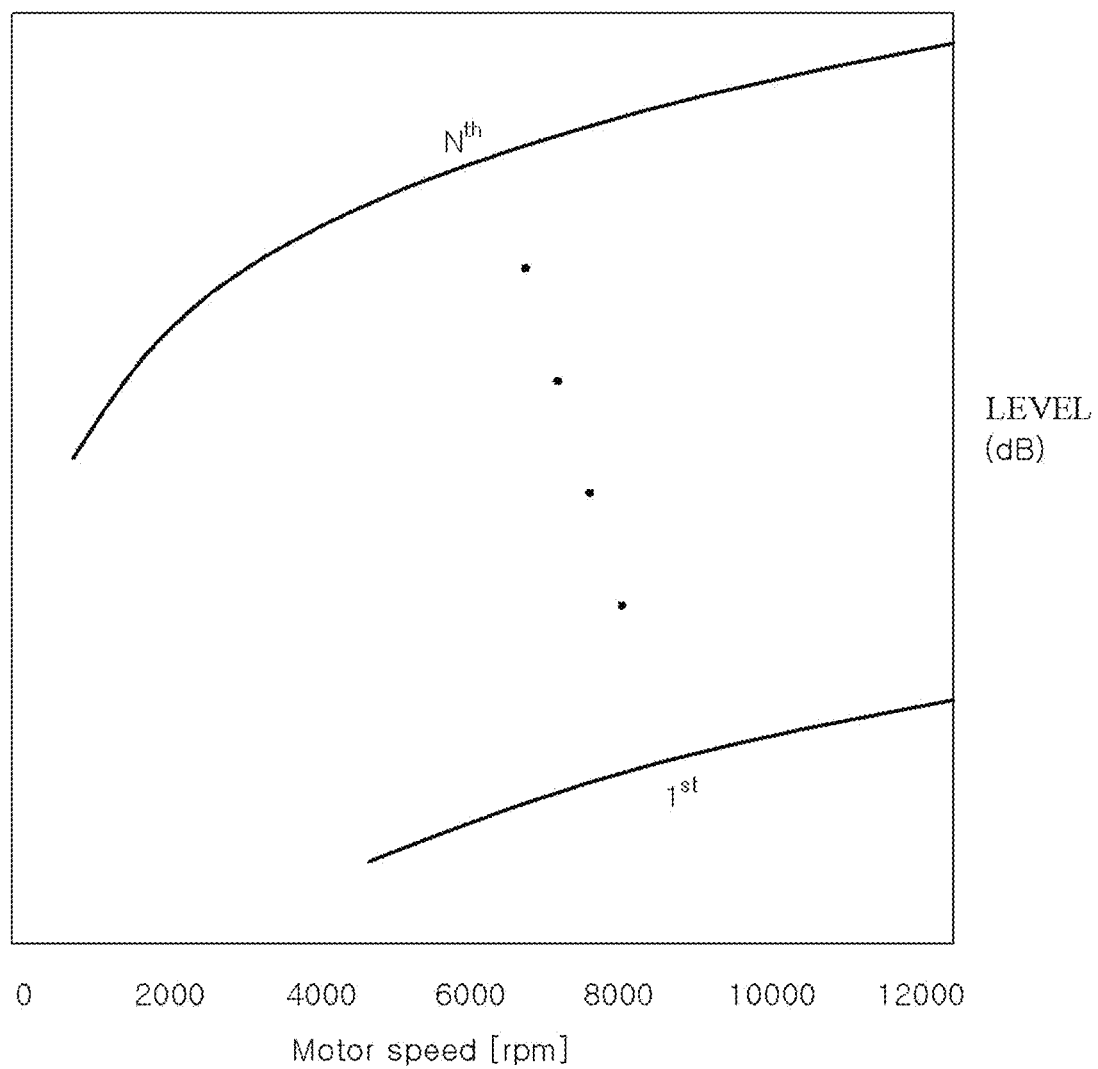

FIGS. 3A,3B and 3C are a graph illustrating an example of changes in order degree and order level according to a change in an output torque for each load. Particularly, the change in order level is an example for a $24^{th}$ order. Accordingly, the graph of the motor RPM—the order degree (N order)—the order level (dB) is completed, and accordingly, the order components with the high correlation with the motor output torque has the determination coefficient ($R^2$) of 0.9 or more and thus the $24^{th}$ order may be determined as a reference (Ref) order component.

Figure 4:
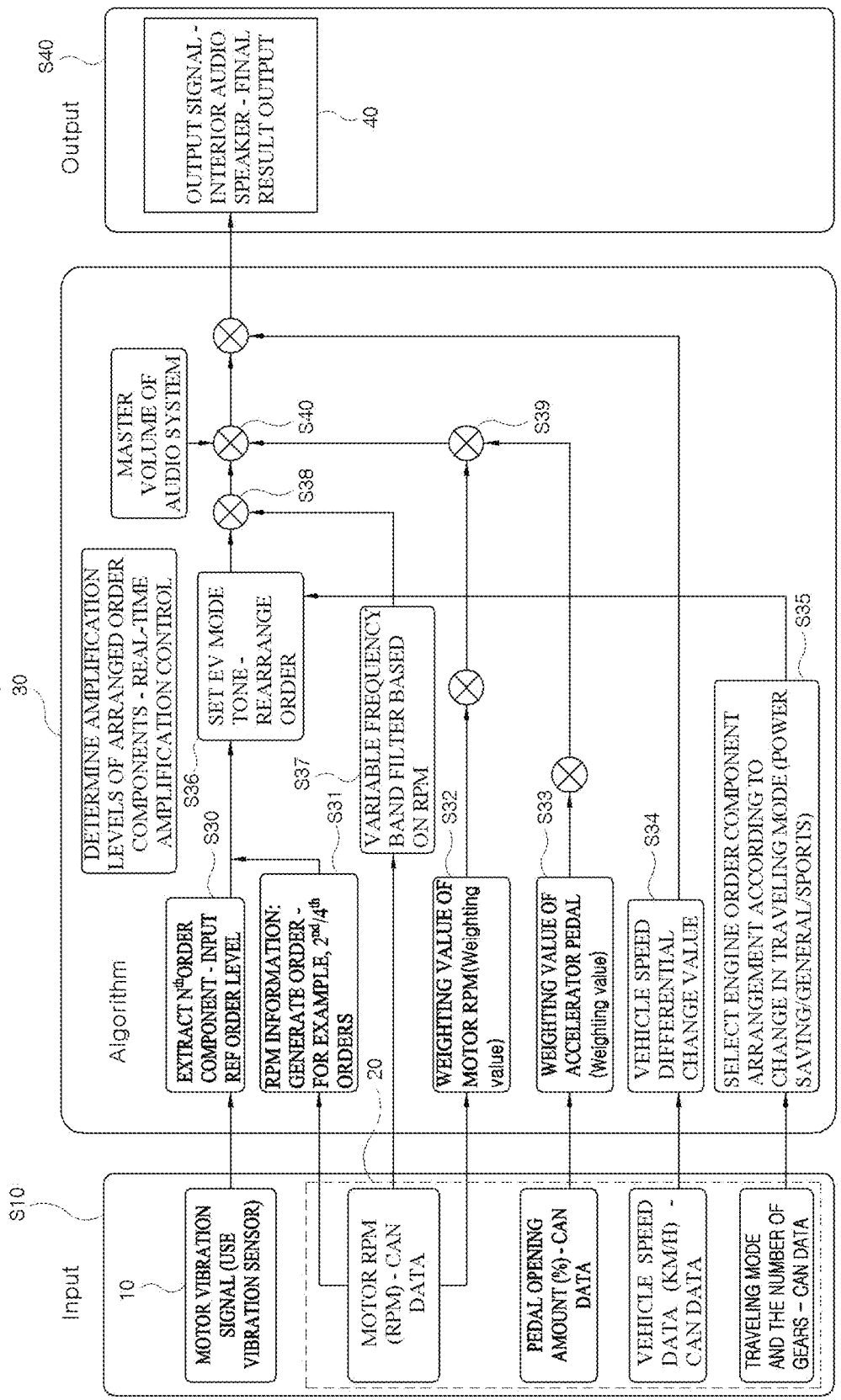
FIG. 4 is a diagram explaining an algorithm from various signal inputs to an output from a sound output device.

FIG. 4 is a diagram explaining the algorithm showing the calculation process from the various signal inputs (S10) to the output (S40) from the sound output device.

The input signal is the vibration signal of the EV motor and is measured using the vibration sensor 10, and the RPM, pedal position, vehicle speed data, traveling mode and the number of gears of the EV motor may be input from the CAN signal 20. The following algorithm is calculated by the signal processing controller 30, and a final output is executed by the sound output device 40 including an interior audio speaker.

The $N^{th}$ order component is extracted from the input vibration signal of the motor, and is set as the reference (Ref) order component and the level for the $N^{th}$ order component, that is, the reference (Ref) order component is determined (S30).

By initially calculating the reference (Ref) order component from the $N^{th}$ order component once to be then input to the signal processing controller, this may be used as the reference (Ref) order component at all times. Meanwhile, the $N^{th}$ order component may also be set to be automatically determined by the signal processing controller by extracting the $N^{th}$ order component from the vibration signal of the motor every specific time.

Meanwhile, order components (for example, $2^{nd}/4^{th}$ orders) generated for the motor RPM obtained in real time may be generated (S31).

When the $N^{th}$ order component which is a reference for inputting the order level is determined in the S30, the orders are rearranged by matching the order components generated in the S31 (S36). At this time, it is possible to determine the amplification level of the level for the arranged order components and control the amplification in real time (S36).

In the S36, it is possible to additionally consider the rearrangement of the order components of the engine according to which one of the power saving/general/sports modes is the traveling mode from the inputs of the traveling mode and the number of gears (S35).

Meanwhile, the calculation value of the EV mode tone set in the S36 may be selectively changed in conjunction with the input signal or an external signal (S38, S39, S40).

First, there is a case of applying a variable frequency band filter based on the motor RPM (S37). The band filter means a band pass filter, and is a filter which removes a component with a certain frequency or less and a component with the certain frequency or more from the input signal and outputs only a frequency within a certain band. The bank filter may also be composed as a combination of a low-pass filter and a high-pass filter. Accordingly, in the S38, the EV mode tone may be implemented only for a certain band region.

In order to reflect the change in power performance of the vehicle in the EV tone control and to implement the sound matching the driver's willingness to accelerate, a weighting value may be given to the motor RPM itself (S32), and may also be given to the position of the accelerator pedal (S33).

In addition, both may also be applied or selected (S39). In addition, a vehicle speed differential change value may be applied to vehicle speed data (S34).

Meanwhile, the algorithm which extracts the $N^{th}$ order component may be selectively determined according to the calculation speed, the accuracy, the calculation amount, or the like.

Figure 5A:
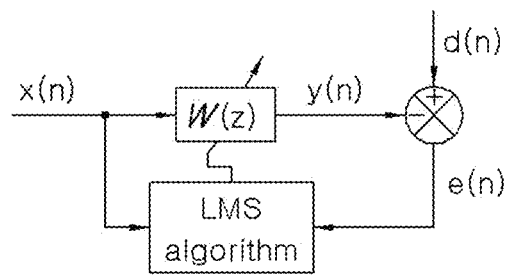

FIGS. 5A and 5B are a diagram illustrating a case of applying a least mean squares (LMS) filter algorithm which is advantageous for the calculation speed. The LMS filter algorithm is a filter technique used for active noise cancellation (ANC), and extracts a target $N^{th}$ order component in the numerical calculation process. The calculation process is illustrated in FIG. 5A, which is ultimately an algorithm for separating the $N^{th}$ order y(n) extracted from the vibration signal from a vibration signal d(n) measured in real time, and to this end, a filter weighting value W(z) is applied thereto. In addition, an $N^{th}$ order level information extraction value x(n) is applied to both the filter weighting value and the LMS algorithm, and the filter weighting value W(z) is repeatedly updated until the set level of the $N^{th}$ order component converges to 0. The filter weighting value W(z) and update are finally completed and then the LMS filter is applied to the vibration signal in real time.

FIG. 5B is a diagram illustrating a change in vibration signal before and after applying the LMS filter.

In setting the $N^{th}$ order component to be extracted from the real-time vibration signal information including the entire order degree, the $N^{th}$ order component with the high correlation with the motor output torque or with the high linearity is determined. As a result of comparing the $N^{th}$ order extracted by the FFT analysis with the $N^{th}$ order extracted by applying the LMS filter, it may be seen that the case of the $N^{th}$ order applying LMS filter is slightly smaller in level and also smaller in the number of data than the $N^{th}$ order through the FFT. That is, when the LMS filter is used, since the number of sampling data is small compared to the FFT, data loss due to resolution occurs, and since the FFT has a higher resolution, the level is also higher.

The overall algorithm to which the above is applied may control the EV motor tone of the electric vehicle by calculating the order components from the vibration signal of the rotating EV motor; extracting the $N^{th}$ order component by updating a weighting value when the vibration signal is recirculated using the LMS filter algorithm with respect to the vibration signal to cause the level of the $N^{th}$ order component to converge to 0 as a step of extracting the $N^{th}$ order component with the greatest linearity for the motor output torque among the calculated order components; calculating an order frequency by transforming the RPM of the EV motor into frequency; setting the EV mode tone by applying the vibration level of the $N^{th}$ order component to the level of the order frequency to be output rearranging the order components; and outputting the set EV mode tone.

FIG. 6 is a diagram illustrating a case of applying a Fast Fourier Transform (FFT)/Inverse Fast Fourier Transform (IFFT) algorithms, which are advantageous for accuracy.

FIG. 6 is a diagram illustrating transforming time data to frequency data. The FFT may be performed for the measured region in a very short time, and the frequency resolution is low. The frequency resolution means how densely interval the value of the corresponding frequency band may be observed when the desired signal is observed in the frequency domain. Accordingly, a Non-equispaced Fast Fourier Transform (NFFT) technique is additionally applied. By forcibly adding M additional zero-padding data to increase the resolution, it is possible to maintain the raw data information measured by the vibration sensor. Finally, by obtaining the FFT data resampled to the level of 2 Hz, it is possible to extract the accurate value of the $N^{th}$ order component using the motor RPM. When the target sound is controlled, the natural sound in which the human ear does not feel a delay is implemented only when a time difference between the input data and the output data satisfies a condition within 30 msec. When the vibration signal is transformed by the FFT, that is, to the frequency domain based on 20 msec data upon measurement, the frequency interval is very wide, thereby not finding the desired dense frequency characteristics. To this end, the NFFT technique may be applied to re-sample the resolution to 2 Hz by performing a zero padding processing by the insufficient number of data.

The overall algorithm to which the above is applied includes: calculating the order components from the vibration signal of the rotating EV motor; extracting the $N^{th}$ order component with the greatest linearity for the motor output torque among the calculated order components; calculating an order frequency by transforming the RPM of the EV motor into frequency; setting the EV mode tone by applying the vibration level of the $N^{th}$ order component to the level of the order frequency to be output rearranging the order components; and outputting the set EV mode tone, and the extracting of the $N^{th}$ order component may control the EV motor tone of the electric vehicle based on the motor vibration which extracts the $N^{th}$ order component by performing the Fast Fourier Transform (FFT) for the vibration signal; performing the resampling through the Non-equispaced Fast Fourier Transform (NFFT); and performing the Inverse Fast Fourier Transform (IFFT).

FIG. 7 is a diagram illustrating a case of applying an order tracking algorithm with a small amount of calculation, and the $N^{th}$ order component is extracted based on RPM information. First, the order components of the vibration signal is extracted through the order tracking calculation, and the $N^{th}$ order is calculated according to the change in motor RPM and the band pass filter is applied.

The overall algorithm to which the above is applied may control the EV motor tone of the electric vehicle by calculating the order components from the vibration signal of the rotating EV motor; extracting the $N^{th}$ order component using the order tracking analysis for the EV motor and the RPM-based band pass filter among the calculated order components; calculating an order frequency by transforming the RPM of the EV motor into frequency; setting the EV mode tone by applying the vibration level of the $N^{th}$ order component to the level of the order frequency to be output rearranging the order components; and outputting the set EV mode tone.

Figure 8A:
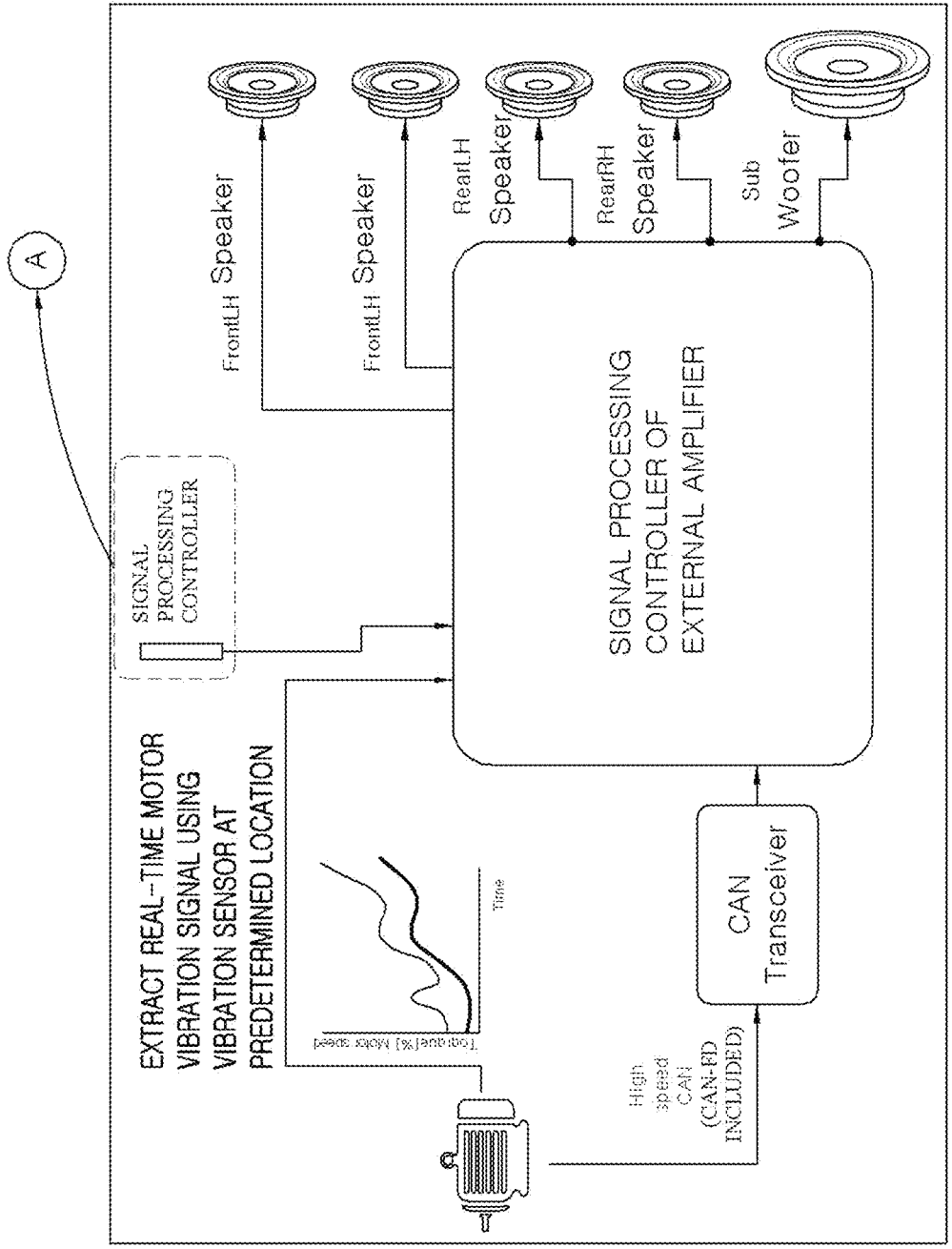

Meanwhile, referring to FIGS. 8A and 8B, a vibration sensor signal processing controller and an external amplifier signal processing controller may be divided. That is, the vibration sensor signal processing controller may extract the $N^{th}$ order component in FIG. 8 (S30), generate the order from the RPM information (S31), and set the EV mode tone (S36). The external amplifier signal processing controller may control the remainder other than the S30, the S31, and the S36.

That is, a micro control unit (MCU) in the external amplifier signal processing controller may perform an integrated EV tone control by receiving the output signal EV tone-controlled in the S30, S31, S36 from the vibration sensor signal processing controller and the CAN information from the vehicle, and output the EV tone through various speakers. A function of providing the target tone output signal of the vibration sensor signal processing controller performs the calculation process in FIG. 4 as it is (S30, S31, S36). Other functions other than the function of providing the target tone output signal may also be processed by the external amplifier signal processing controller as illustrated in FIGS. 8A and 8B.

What is claimed is:

1. A method for controlling a tone of an electric vehicle (EV) based on motor vibration, the method comprising:
   calculating, by a signal processing controller, an order component from a vibration signal of a EV motor;
   extracting, by the signal processing controller, an $N^{th}$ order component with the greatest linearity for motor output torque among the calculated order component;
   calculating, by the signal processing controller, an order frequency by transforming revolutions per minute (RPM) of the EV motor into a frequency; and
   setting, by the signal processing controller, an EV mode tone by applying a vibration level of the $N^{th}$ order component to a level of the order frequency to be output and rearranging the order component;
   wherein the extraction of the $N^{th}$ order component includes extracting the first order component with a determination coefficient ($R^2$) greater than or equal to 90 percent.

2. The method of claim 1, wherein the calculation of the order component includes:

calculating the order component from a vibration sensor configured to sense the vibration signal of the EV motor.

3. The method of claim 2, wherein the method further comprises:
sweeping frequencies, by the vibration sensor, when a highest amplitude is detected.

4. The method of claim 2, wherein the vibration sensor is a knocking sensor.

5. The method of claim 1, wherein the method further comprises:
outputting the set EV mode tone; and
adjusting, by the vibration sensor signal processing controller, an output volume by applying a frequency band pass filter based on the RPM of the EV motor before the outputting.

6. The method of claim 1, wherein the method further comprises:
outputting the set EV mode tone; and
adjusting an output volume by assigning a weighting value to the RPM of the EV motor before the outputting.

7. The method of claim 1, wherein the method further comprises:
outputting the set EV mode tone; and
adjusting an output volume by assigning a weighting value to the pedal position before the outputting.

8. The method of claim 1, wherein the method further comprises:
outputting the set EV mode tone; and
adjusting an output volume by calculating a differential change value of vehicle speed before the outputting.

9. The method of claim 1, wherein the method further comprises:
selecting the order component according to a change in a traveling mode, wherein the traveling mode comprises a power saving mode, a general mode, and a sport mode; and
using the selected order component when setting the EV mode tone.

10. A method for controlling a tone of an electric vehicle (EV) based on motor vibration, the method comprising:
calculating, by a vibration sensor signal processing controller, an order component from a vibration signal of a EV motor;
extracting, by the vibration sensor signal processing controller, an $N^{th}$ order component with the greatest linearity for motor output torque among the calculated order component;
calculating, by the vibration sensor signal processing controller, an order frequency by transforming revolutions per minute (RPM) of the EV motor into a frequency;
setting, by the vibration sensor signal processing controller, an EV mode tone by applying a vibration level of the $N^{th}$ order component to a level of the order frequency to be output and rearranging the order component; and
outputting the set EV mode tone,
wherein the extracting of the $N^{th}$ order component comprises:
extracting the $N^{th}$ order component by updating a weighting value when the vibration signal is recirculated using an LMS filter algorithm for the vibration signal to cause the level of the $N^{th}$ order component to converge to 0.

11. A method for controlling a tone of an electric vehicle (EV) based on motor vibration, the method comprising:
calculating, by a vibration sensor signal processing controller, an order component from a vibration signal of a EV motor;
extracting, by the vibration sensor signal processing controller, a $N^{th}$ order component with the greatest linearity for motor output torque among the calculated order component;
calculating, by the vibration sensor signal processing controller, an order frequency by transforming revolutions per minute (RPM) of the EV motor into a frequency;
setting, by the vibration sensor signal processing controller, an EV mode tone by applying a vibration level of the $N^{th}$ order component to a level of the order frequency to be output and rearranging the order component; and
outputting the set EV mode tone,
wherein the extracting of the $N^{th}$ order component comprises:
extracting the $N^{th}$ order component through:
performing Fast Fourier Transform (FFT) for the vibration signal;
performing resampling through a Non-equispaced Fast Fourier Transform (NFFT); and
performing an Inverse Fast Fourier Transform (IFFT).

12. A method for controlling a tone of an electric vehicle (EV) based on motor vibration, the method comprising:
calculating, by a vibration sensor signal processing controller, an order component from a vibration signal of a EV motor;
extracting, by the vibration sensor signal processing controller, an $N^{th}$ order component with the greatest linearity for motor output torque among the calculated order component;
calculating, by the vibration sensor signal processing controller, an order frequency by transforming revolutions per minute (RPM) of the EV motor into a frequency;
setting, by the vibration sensor signal processing controller, an EV mode tone by applying a vibration level of the $N^{th}$ order component to a level of the order frequency to be output and rearranging the order component; and
outputting the set EV mode tone,
wherein the extracting of the $N^{th}$ order component comprises:
extracting the $N^{th}$ order component using order tracking analysis for the EV motor and an RPM-based band pass filter.

13. The method of claim 10, wherein the method further comprises:
sweeping frequencies, by a vibration sensor, when a highest amplitude is detected.

14. The method of claim 13, wherein the vibration sensor is a knocking sensor.

15. The method of claim 10, wherein the method further comprises:
adjusting, by an external amplifier signal processing controller, an output volume by applying a frequency band pass filter based on the RPM of the EV motor before the outputting.

16. The method of claim 10, wherein the method further comprises:

adjusting, by an external amplifier signal processing controller, an output volume by assigning a weighting value to the RPM of the EV motor before the outputting.

17. The method of claim 10, wherein the method further comprises:
adjusting, by an external amplifier signal processing controller, an output volume by assigning a weighting value to the pedal position before the outputting.

18. The method of claim 10, wherein the method further comprises:
adjusting, by an external amplifier signal processing controller, an output volume by calculating a differential change value of vehicle speed before the outputting.

19. The method of claim 10, wherein the method further comprises:
selecting the order component according to a change in a traveling mode, wherein the traveling mode comprises a power saving mode, a general mode, and a sport mode; and
using the selected order component when setting the EV mode tone.

\* \* \* \* \*